(12) United States Patent
Yeo et al.

(10) Patent No.: US 10,395,987 B2
(45) Date of Patent: Aug. 27, 2019

(54) TRANSISTOR WITH SOURCE-DRAIN SILICIDE PULLBACK

(71) Applicant: GLOBALFOUNDRIES Singapore Pte. Ltd., Singapore (SG)

(72) Inventors: Chia Ching Yeo, Singapore (SG); Kiok Boone Elgin Quek, Singapore (SG); Khee Yong Lim, Singapore (SG); Jae Han Cha, Singapore (SG); Yung Fu Chong, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 1 day.

(21) Appl. No.: 15/402,150

(22) Filed: Jan. 9, 2017

(65) Prior Publication Data

US 2017/0200649 A1    Jul. 13, 2017

Related U.S. Application Data

(60) Provisional application No. 62/276,200, filed on Jan. 7, 2016.

(51) Int. Cl.
*H01L 21/8234* (2006.01)
*H01L 27/088* (2006.01)
*H01L 29/66* (2006.01)
*H01L 29/78* (2006.01)

(52) U.S. Cl.
CPC ........... *H01L 21/823418* (2013.01); *H01L 21/823443* (2013.01); *H01L 21/823456* (2013.01); *H01L 21/823468* (2013.01); *H01L 27/088* (2013.01); *H01L 29/6656* (2013.01); *H01L 29/66515* (2013.01); *H01L 29/7833* (2013.01); *H01L 21/823462* (2013.01)

(58) Field of Classification Search
CPC ..... H01L 21/823418; H01L 21/823443; H01L 27/088; H01L 21/823468; H01L 21/823456; H01L 29/6659–66598; H01L 29/7833; H01L 29/78621–78627; H01L 2029/7863; H01L 29/78696
See application file for complete search history.

(56) References Cited

U.S. PATENT DOCUMENTS 6,010,929 A * 1/2000 Chapman .......... H01L 21/82385
                                                      257/E21.638
6,025,239 A * 2/2000 Yu .................... H01L 27/0266
                                                      438/302

(Continued)

*Primary Examiner* — Cuong B Nguyen
(74) *Attorney, Agent, or Firm* — Thompson Hine LLP (57) ABSTRACT

The disclosure is related to MV transistors with reduced gate induced drain leakage (GIDL) and impact ionization. The reduced GILD and impact ionization are achieved without increasing device pitch of the MV transistor. A low voltage (LV) device region and a medium voltage (MV) device region are disposed on the substrate. Non-extended spacers are disposed on the sidewalls of the LV gate in the LV device region; extended L shaped spacers are disposed on the sidewalls of the MV gate in the MV device region. The non-extended spacers and extended L shape spacers are patterned simultaneously. Extended L shaped spacers displace the MV heavily doped (HD) regions a greater distance from at least one sidewall of the MV gate to reduce the GIDL and impact ionization of the MV transistor.

18 Claims, 11 Drawing Sheets

(56) References Cited

U.S. PATENT DOCUMENTS

| | | | | |
|---|---|---|---|---|
| 6,492,234 B1* | 12/2002 | Moroni | ............ | H01L 21/823814 |
| | | | | 257/E21.427 |
| 6,723,609 B2* | 4/2004 | Yang | ................. | H01L 21/28518 |
| | | | | 257/E21.165 |
| 2007/0037336 A1* | 2/2007 | Kwon | ............. | H01L 21/823468 |
| | | | | 438/197 |
| 2009/0212342 A1* | 8/2009 | Roizin | ................... | G11C 16/10 |
| | | | | 257/316 |
| 2010/0244155 A1* | 9/2010 | Carter | ............. | H01L 21/823807 |
| | | | | 257/410 |
| 2011/0156173 A1* | 6/2011 | Usujima | ............. | H01L 29/1083 |
| | | | | 257/402 |
| 2015/0228742 A1* | 8/2015 | Kim | ................ | H01L 21/823468 |
| | | | | 257/344 |

* cited by examiner

TRANSISTOR WITH SOURCE-DRAIN SILICIDE PULLBACK

CROSS-REFERENCE TO RELATED APPLICATION

This application claims the benefit of and priority to U.S. Provisional Patent Application No. 62/276,200, filed on Jan. 7, 2016, which is hereby incorporated by reference in its entirety.

BACKGROUND

Integrated circuits (ICs) include numerous devices, such as transistors and other components, which are interconnected to produce the desired functions. The IC, for example, may include metal oxide semiconductor field effect transistors (MOSFETs) which operate at different voltage ranges. For example, an IC includes low voltage (LV) transistors, medium voltage (MV) transistors and high voltage (HV) transistors. A LV transistor may operate at about 1.2 V, the MV transistor may operate at about 7.7 V while a HV transistor may operate at about 20 V.

However, in conventional ICs, MV transistors may have the drain biased at as high as, for example, 8.47 V. For example, the drain may be biased at about 10% higher than the operating voltage as of 7.7V. Such a high biasing at the drain causes high drain to bulk leakage in the off state ($I_{doff}$) attributed to gate induced drain leakage (GIDL). High $I_{doff}$ results in excessive static power consumption. This is undesirable, particularly for portable applications which operate on battery power.

The disclosure is directed to MV transistors with reduced GIDL. The reduced GILD is achieved without increasing device pitch of the MV transistor.

SUMMARY

Embodiments of the present disclosure generally relate to semiconductor devices and methods for forming a semiconductor device. In one embodiment, a method for forming a device is disclosed. A substrate prepared with a low voltage (LV) device region and a medium voltage (MV) region is provided. A LV gate is formed in the LV region and LV lightly doped (LD) regions are formed in the substrate in the LV device region adjacent to the LV gate. A MV gate is formed in the MV region and MV LD regions are formed in the substrate in the MV device region adjacent to the MV gate. A spacer layer which lines the substrate, the LV gate and the MV gate is formed on the substrate. The spacer layer is patterned to form non-extended spacers on first and second sidewalls of the LV gate and at least one extended L-shaped (extended L) spacer on at least one sidewall of the MV gate simultaneously. LV heavily hoped (HD) regions are formed in the substrate adjacent to the non-extended spacers on first and sidewalls of the LV gate. MV HD regions are formed in the substrate adjacent to the extended L spacers on first and sidewalls of the MV gate. The extended L spacers displaces the MV HD regions a greater distance from at least one sidewall of the MV gate to reduce gate induced drain leakage (GIDL) and impact ionization of a MV transistor in the MV device region.

In another embodiment, a device is disclosed. The device includes a substrate having circuit components disposed on a substrate surface. A LV device region is disposed on the substrate. The LV device region includes a LV gate, LV LD regions disposed adjacent to the LV gate, non-extended spacers disposed on first and second sidewalls of the LV gate, and LV HD regions disposed adjacent to the non-extended spacers. A MV device region is disposed on the substrate. The MV device region includes a MV gate, MV LD regions, at least one extended L spacers disposed on at least one sidewall of the MV gate, and MV HD regions disposed adjacent to the extended L spacers on the sidewalls of the MV gate. The extended L spacers are formed simultaneously with the non-extended spacers.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to medium voltage (MV) devices. The devices or ICs can be incorporated into or used with, for example, consumer electronic products, particularly portable consumer products, such as cell phones, laptop computers and personal digital assistants (PDAs).

The fabrication of devices may involve the formation of features on a substrate that make up circuit components, such as transistors, resistors and capacitors. The devices are interconnected, enabling the ICs to perform the desired functions. To form the features and interconnections, layers are repeatedly deposited on the substrate and patterned as desired using lithographic techniques. For example, a wafer is patterned by exposing a photoresist layer with the pattern on a reticle with an exposure source. After exposure, the photoresist layer is developed, where the pattern of the reticle is transferred to the photoresist, and a photoresist etch mask is created. An etch is performed using the etch mask to replicate the pattern on the wafer below, which may include one or more layers, depending on the stage of the process. In the formation of an IC, numerous reticles may be used for different patterning processes. Furthermore, a plurality of ICs may be formed on the wafer in parallel.

Figure 1:
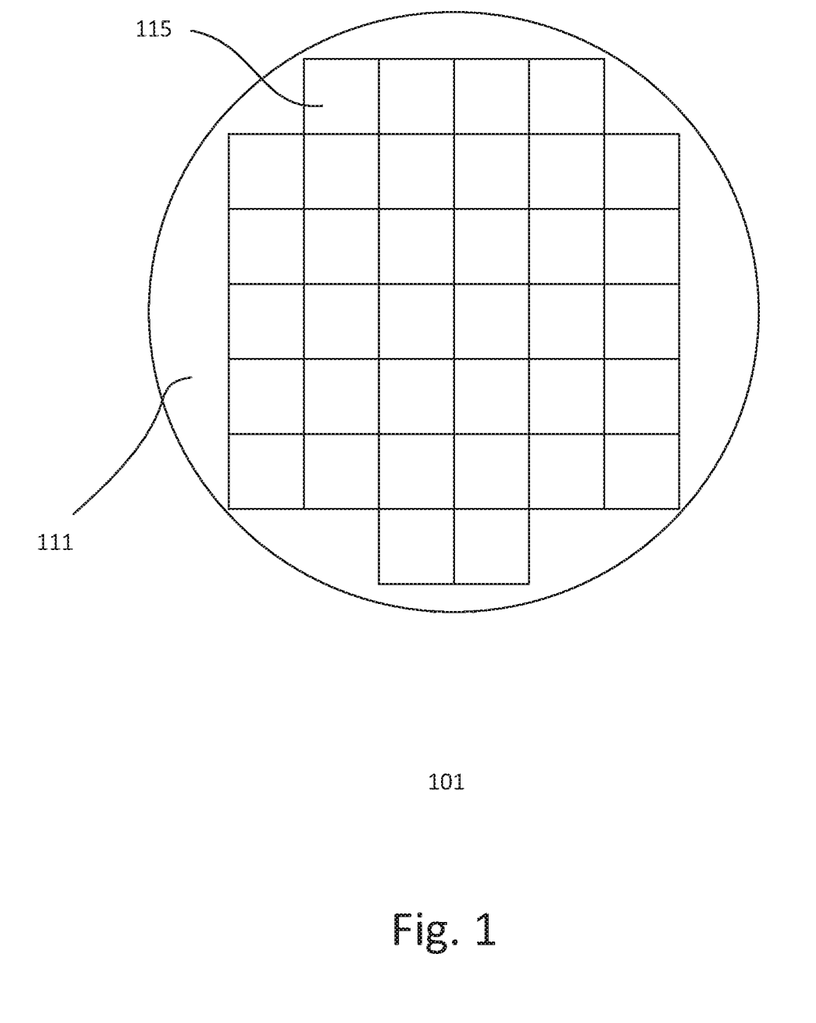
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doped wafers with other types of dopants or dopant concentrations may also be useful.

The wafer includes an active surface 111 on which devices 115 are formed. A plurality of devices may be formed on the wafer in parallel. The devices, for example, are arranged in rows along a first (x) direction and columns along a second (y) direction. Wafer dicing process is then performed. When the process is completed, the wafer is diced along the dicing channels to singulate the devices into individual chips.

Figure 2:
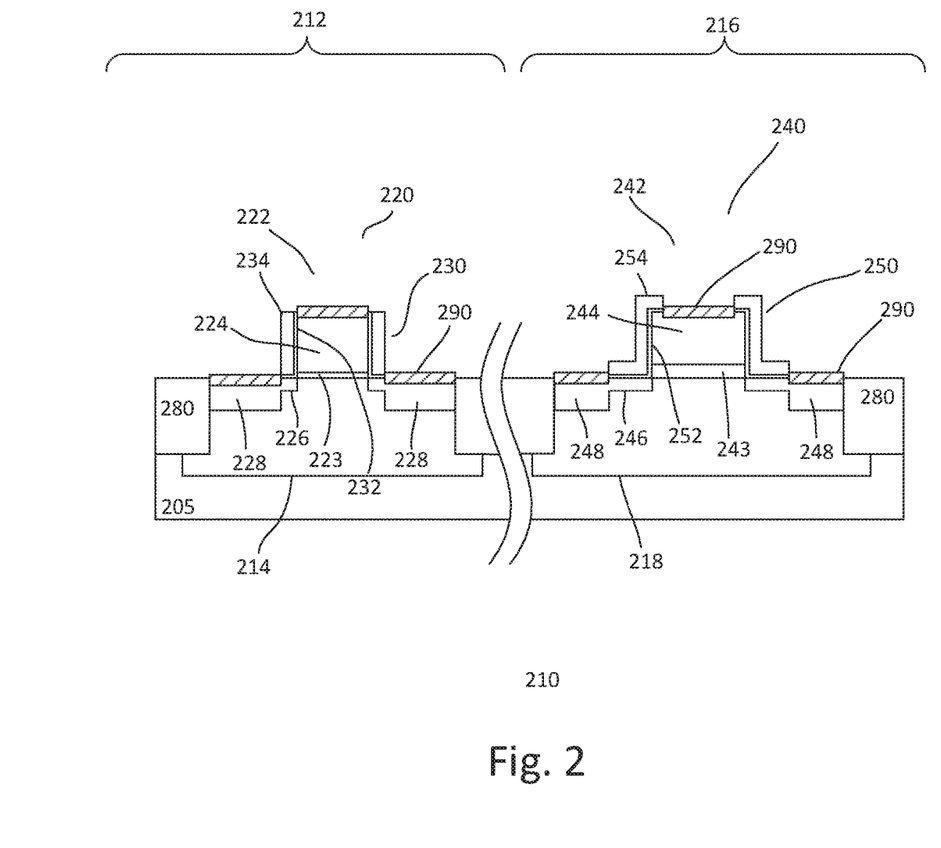
FIG. 2 shows a simplified cross-sectional view of an embodiment of a device.

FIG. 2 shows a simplified embodiment of a device 115. The device, for example, is an integrated circuit (IC). Other types of devices may also be useful. The device, for example, may be formed in parallel on a wafer and subsequently be singulated. The device includes a substrate 205. The device, for example, may be a part of the wafer, as described in FIG. 1. Common elements may not be described or described in detail. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $10^{16}$ to $10^{17}$ cm$^{-3}$, an intermediately doped region may have a dopant concentration of about $10^{18}$ to $10^{19}$ cm$^{-3}$, and a heavily doped region may have a dopant concentration of about $10^{20}$ to $10^{21}$ cm$^{-3}$. The doping concentrations, for example, are for 55 nm technology node. Providing other dopant concentrations for the different doped regions may also be useful. For example, dopant concentrations may vary depending on, for example, the technology node. P-type dopants may include boron (B), aluminum (Al), indium (In) or a combination thereof, while n-type dopants may include phosphorous (P), arsenic (As), antimony (Sb) or a combination thereof.

The substrate of the device, as shown, includes first and second device region 212 and 216. In one embodiment, the first region is a low voltage (LV) device region while the second device region is a medium voltage (MV) voltage device region. The LV device region includes a LV transistor 220 while the MV region includes a MV transistor 240. The transistors, in one embodiment, are metal oxide semiconductor (MOS) transistors. A LV transistor operates at a lower voltage than an MV transistor. For example, a LV transistor operates at about 1.2 V and the MV transistor operates at about 7.7 V. The operating voltages may be for transistors at 55 nm technology node. The substrate may include other device regions (not shown). For example, the substrate may include high voltage (HV) device regions for HV transistors. HV transistors operate at higher voltages than MV transistors. For example, HV transistors operate at about 20 V. The device may also include other device regions, such as a memory region for memory devices. Other types of components or device regions may also be useful. The specified operating voltages of the different types of transistors, for example, are based on a 55 nm technology node. Other operating voltages may be useful. For example, operating voltages may be different for different technology nodes or operating platforms or applications.

A deep isolation well (not shown) is disposed in the substrate. For example, a first deep isolation well is disposed in the first device region and a second deep isolation well is disposed in the second device region. Both deep isolation wells may include n-type dopants in LV and MV device regions. The n-type deep isolation wells are formed beneath their lighter doped wells. The deep isolation well is to isolate the device wells (such as p-doped well or n-doped well) from higher voltage devices (such as a n-type FET or a p-type FET).

Isolation regions may be provided for isolating or separating different regions of the substrate. In one embodiment, the device region is isolated from other regions by a device isolation region 280. For example, the device isolation region surrounds the device region. The isolation region may be a shallow trench isolation (STI) region. A STI region includes an isolation trench filled with isolation or dielectric materials. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

A first device well 214 is disposed in the substrate in the first device region. In one embodiment, the device well is disposed within the device isolation region of the first device on the first deep isolation well. The device well serves as a body for the LV transistor. For example, the device well is a LV device well for the LV transistor. In one embodiment, the depth or bottom of the device well is below the device isolation region surrounding the first device region. Providing a device well having other depths may also be useful.

A second device well 218 is disposed in the substrate in the second device region. In one embodiment, the second device well is disposed within the device isolation region of the second device region on the second deep isolation well. The device well serves as a body for the MV transistor. For example, the device well is a MV device well for the MV transistor. In one embodiment, the depth or bottom of the device well is below the device isolation region surrounding the second device region. Providing a device well having other depths may also be useful.

A device well includes second polarity dopants for a first polarity type device. For example, a device well includes p-type dopants for an n-type transistor device or n-type dopants for a p-type device. The dopant concentration may depend on the voltage requirement of the device. The device well may be lightly ($x^-$) or intermediately (x) doped with second polarity type dopants. Other dopant concentration for the device well, for example, dopant concentration greater than that of the lightly doped substrate, may also be useful. In one embodiment, the LV device well has a dopant concentration of about $10^{18}$ cm$^{-3}$ while the MV device well has a dopant concentration of about $10^{17}$ cm$^{-3}$. For example, a LV device well has higher dopant concentration than the MV device well. Generally, higher voltage devices have lighter doped device wells.

A deep isolation well (not shown) may be provided for the first and second device regions. The deep isolation well, for example, is a n-type doped well. The deep isolation well isolates the device regions from higher voltage devices.

The first or LV transistor includes a gate 222 disposed on the surface of the substrate in the first device region. The gate is disposed between first and second source/drain (S/D) regions 228 in the substrate. For example, the LV transistor includes a LV gate disposed on a surface of the substrate in the LV device region between first and second LV S/D regions in the LV device well. The substrate region under the gate and between the S/D regions forms a channel of the transistor. The LV gate includes a LV gate electrode 224 and a LV gate dielectric 223. The LV gate dielectric is disposed on the substrate surface and the LV gate electrode is disposed thereover. The gate electrode may be polysilicon and the gate dielectric may be silicon oxide. Other types of gate electrodes and gate dielectrics may also be useful. The LV gate may have a channel length of about 0.06 um for 55 nm technology. Other channel lengths may also be useful.

The LV S/D regions include first polarity type dopants. In one embodiment, a LV S/D region includes a lightly doped (LD) region 226 proximate to the gate and a heavily doped (HD) region 228 disposed away from the gate. The LV LD region extends under the gate edge. The LV HD region may have a depth which is deeper than the LV LD region. For example, the LV LD region has a depth of about 0.05 um and the LV HD region has a depth of about 0.1 um. Other depths or configurations of the LD and HD regions may also be useful.

The LV gate includes LV spacers 230 disposed on sidewalls of the LV gate. The spacers, for example, are dielectric spacers. In one embodiment, the spacers are composite spacers, each having multiple layers. For example, the spacer includes first and second spacer layers 232 and 234. The first spacer layer may be a silicon oxide layer, such as a low temperature oxide (LTO) layer, and the second spacer layer is a silicon nitride layer. The oxide layer lines the sidewalls of the gate and substrate surface and the nitride layer is disposed thereon. The oxide layer serves as an adhesion layer to the nitride layer. The thickness of the oxide layer may be about 6 nm while the thickness of the nitride layer is about 37 nm. Other thicknesses of the spacer layers may also be useful.

The spacers serve to displace the LV HD regions from the gate sidewalls. The displacement $D_L$ of the LV HD regions from the gate sidewalls is less than the total thickness of the spacer. The reduced displacement $D_L$ results from loss during etching or cleaning process for forming the spacers. For example, in the case of 55 nm technology node which has spacer layer thickness of 43 nm, the $D_L$ may be about 35 nm. Other $D_L$s may also be useful. The spacers facilitate in forming the S/D regions. For example, the LV LD regions are formed prior to the formation of the spacers while the LV HD regions are formed after the formation of the spacers.

The second or MV transistor includes a gate 242 disposed on the surface of the substrate in the second device region. The gate is disposed between first and second source/drain (S/D) regions 248 in the substrate. For example, the MV transistor includes a MV gate disposed on a surface of the substrate in the MV device region between first and second MV S/D regions in the MV device well. The substrate region under the gate and between the S/D regions forms a channel of the transistor. The MV gate includes a MV gate electrode 244 and a MV gate dielectric 243. The gate dielectric is disposed on the substrate surface and the gate electrode is disposed thereover. The MV gate electrode may be polysilicon and the MV gate dielectric may be silicon oxide. Other types of gate electrodes and gate dielectrics may also be useful. The MV gate, for example, is wider than the LV gate. For example, the MV gate may have a channel length of about 1 um. Other channel lengths may also be useful. In addition, a channel width of the MV transistor is wider than that of the LV transistor.

The MV S/D regions include first polarity type dopants. In one embodiment, a MV S/D region includes a MV LD region 246 proximate to the gate and a MV HD region 248 disposed away from the gate. As shown, the MV LD region extends under the gate. The MV LD region may be deeper than the MV HD region. For example, the MV LD region has a depth of about 0.2 um to 0.4 um and the MV HD region has a depth of about 0.1 um. Other depths of configurations of the LD and HD regions may also be useful. In other embodiments, the HD region is deeper than the LD regions.

The MV gate includes MV spacers 250 disposed on sidewalls of the MV gate. The MV spacers, for example, are dielectric spacers. For example, the MV spacers are composite spacers, each having multiple layers, similar to the LV spacers. In one embodiment, the MV spacers are extended spacers. For example, the MV spacers are extended L-shaped (extended L) spacers. The extended spacers displace the HD S/D regions by a distance $D_M$ from the sidewalls of the gate. In one embodiment, $D_M$ is greater than $D_L$. The distance $D_M$ should be sufficient to reduce $I_{doff}$ attributed to GIDL. The distance $D_M$ may be about 100 nm. Displacing the MV HD S/D by other distances may also be useful. In one embodiment, the extended L spacers overlap the top of the gate by $O_G$. The amount $O_G$ may be about 10 nm. Overlapping the top of the gate by other amount may also be useful. Providing extended L spacers reduces the surface area of the HD SD regions as compared to non-extended spacers. This enables the MV device to maintain the same pitch or size of conventional MV transistors without extended L spacers. Extended L spacers can be formed on either one side or both sides of the gate.

In one embodiment, an extended L spacer is formed on only one of the sidewalls of the MV gate. As for the other sidewall of the MV gate, it includes a non-extended spacer. For example, this produces an asymmetrical MV transistor. In the case of the asymmetrical MV transistor, only the drain side of the transistor is subjected to high bias voltage, producing a unidirectional switch. The extended L spacer is provided on the drain side of the transistor which is subjected to high drain bias.

In one embodiment, the dopant concentration of the LV LD region is about $10^{19}$ cm$^{-3}$ while the LV HD region is about $10^{20}$-$10^{21}$ cm$^{-3}$. As for the MV LD region, it has a dopant concentration of about $10^{18}$ cm$^{-3}$ while the MV HD region is about $10^{20}$-$10^{21}$ cm$^{-3}$. For example, the MV LD region has lighter dopant concentration as compared to LV LD region. As for the MV HD and LV HD regions, they have about same dopant concentration. Other configuration of the LD and HD S/D regions may also be useful.

Metal silicide contacts 290 may be provided on terminals or contact regions of the transistor. For example, metal silicide contacts may be provided on exposed top surface of the gate electrode and exposed S/D regions. The silicide contacts, for example, may be nickel-based silicide contacts. Other types of metal silicide contacts may also be useful. For example, the metal silicide contact may be cobalt silicide (CoSi). The silicide contacts may be about 50-300 Å thick. Other thicknesses of silicide contacts may also be useful. The silicide contacts may be employed to reduce contact resistance and facilitate contact to the back-end-of-line metal interconnects.

As described, the MV transistor in the MV device region includes extended L spacers. The extended L spacers serve to pull back the MV S/D regions and metal silicide contacts away from the MV gate. For example, the MV S/D regions and metal silicide contacts are displaced farther away from the gate compared to non-extended spacers, such as those on the sidewalls of the LV gate. Pulling back the S/D regions and metal silicide contacts in the MV transistor improves gate induced leakage current which reduces $I_{doff}$. In addition, impact ionization in the MV transistor is reduced due to the use of lighter doping for the MV LD regions. The advantages achieved by the pulling back of the S/D regions and metal silicide contacts away from the gate, as discussed, are achieved without increasing the device pitch. For example, device size is not increased compared to the conventional MV transistors without extended L spacers.

Although only one LV region for one first polarity type LV device and one MV region for one first polarity type MV device are shown for simplification, it is understood that the device includes numerous other device regions. For example, it may include device regions for numerous first and second polarity type devices, including LV, MV and HV devices as well as memory regions for memory devices, forming a complementary MOS (CMOS) device. In the case of a second polarity type device region, it includes first polarity type doped wells which serve as the body for a second polarity type device. Other configuration of device regions may also be useful.

Figure 3A:
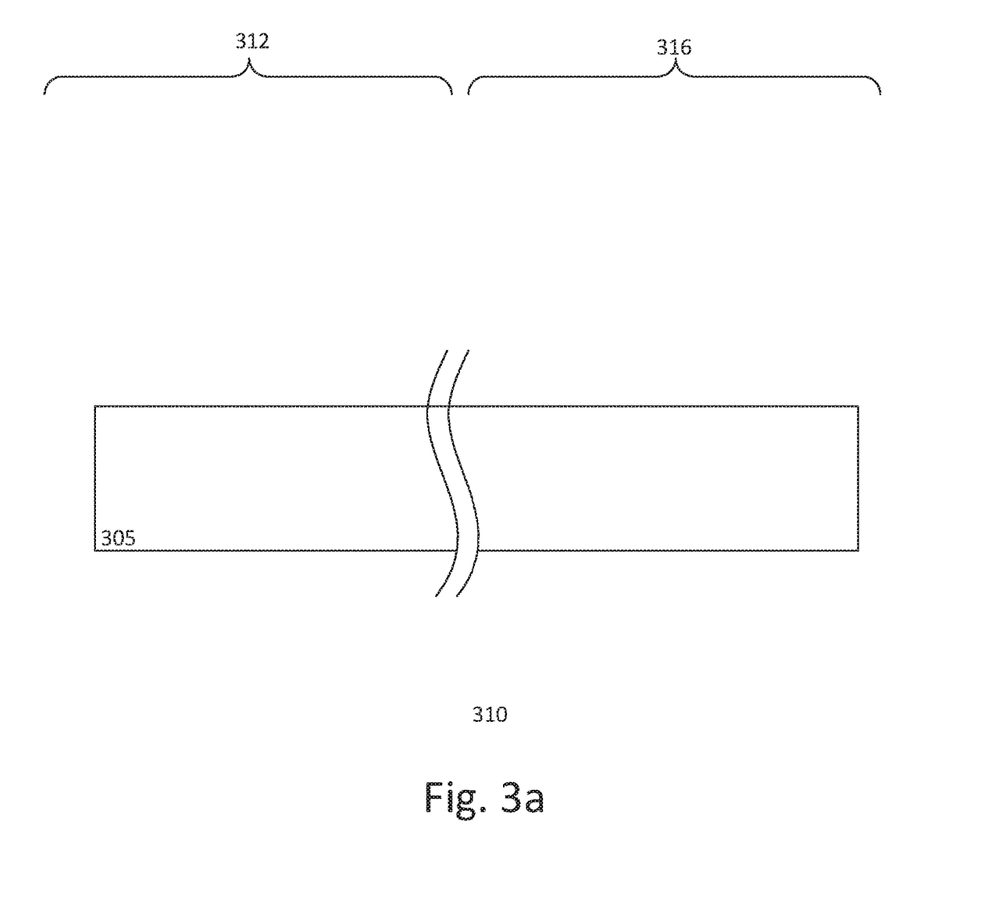
FIGS. 3a-i show cross-sectional views of an embodiment of a process for forming a device.

FIGS. 3a-i show cross-sectional views of an embodiment of a process for forming a device 310. The device, for example, is similar to that described in FIG. 2. As such, common elements may not be described or described in detail. Referring to FIG. 3a, a substrate 305 is provided. The substrate, in one embodiment, is a silicon substrate. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations as well as an undoped substrate, may also be useful.

The substrate, as shown, is prepared with first and second device regions 312 and 316. In one embodiment, the first region serves as a low voltage (LV) device region while the second device region serves a medium voltage (MV) voltage device region. The substrate may include other device regions (not shown). For example, the substrate may include high voltage (HV) device regions for HV transistors. The device may also include other device regions, such as a memory region for memory devices. Other types of components or device regions may also be useful.

A deep isolation well (not shown) may be formed in the substrate. The deep isolation well, for example, may serve to isolate the device region from the substrate. The isolation well includes an opposite polarity type dopant than the doped substrate. For example, in the case of a lightly doped p-type substrate, the deep isolation well may be n-type. For example, the n-type deep isolation well is implemented by an implant mask. The dopant concentration of deep isolation well may be $10^{16}$ to $10^{17}$ cm$^{-3}$. Other dopant concentrations for the deep isolation well may also be useful. The depth of the deep isolation well is sufficient to isolate the device regions from the substrate. The depth, for example, may be about 2.5 um. Other depths for the deep isolation well may also be useful. Forming the deep isolation well may be achieved by implanting isolation well dopants. In some cases, multiple implants may be employed to form the deep isolation well.

Figure 3B:
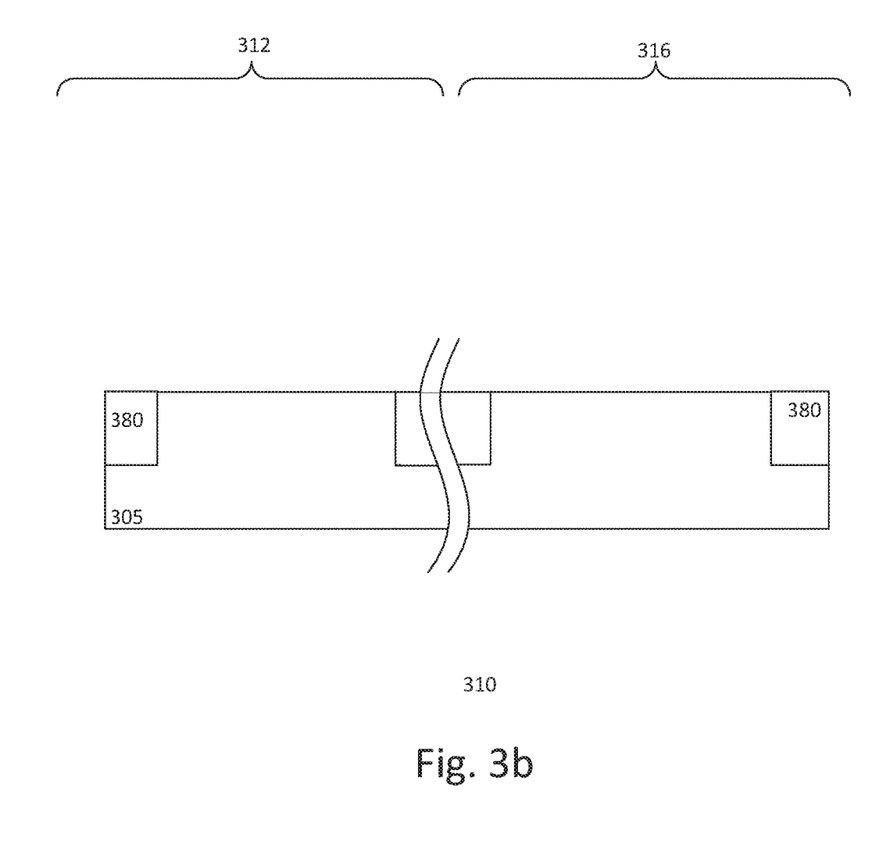

In FIG. 3b, isolation regions 380 are formed. The isolation regions, for example, are STI regions. Other types of isolation regions may also be formed. A STI region surrounds a device region. For example, a first isolation region surrounds the first device region and a second isolation region surrounds the second device region. Various processes can be employed to form the STI regions. For example, the substrate can be etched using etch and mask techniques to form isolation trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000-5000 Å. Other depths for the STIs may also be useful.

Figure 3C:
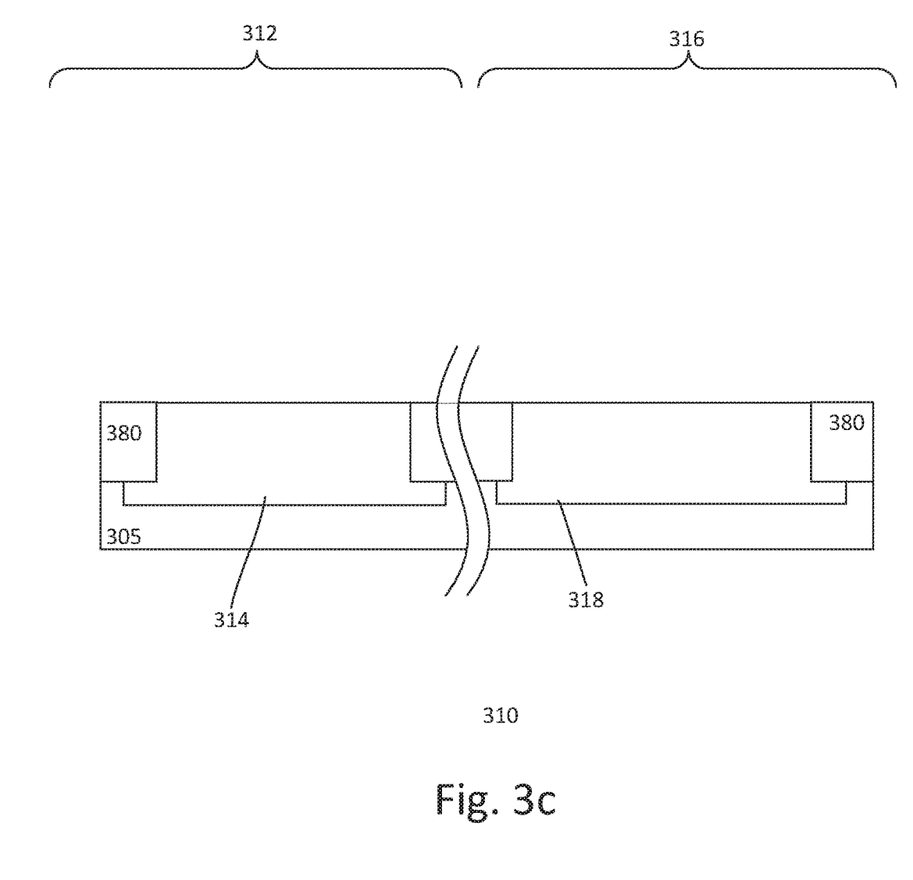

As shown in FIG. 3c, device wells are formed in the device regions. In one embodiment, a first device well 314 formed in the first device region and a second device well 318 is formed in the second device region. The first device well serves as a body for a LV transistor and the second device well serves as a body for a MV transistor. In one embodiment, the device wells include second polarity type dopants for a first polarity type transistor. For example, the second polarity type first device well serves as a body for a first polarity type LV transistor and the second polarity type second device well serves as a body for a first polarity type MV transistor. The dopant concentration for the first device well is about $10^{18}$ cm$^{-3}$ while the dopant concentration of the second device well is about $10^{17}$ cm$^{-3}$. The depth of the first device well is different from the depth of the second device well. For example, the first device well has a depth of about 1.5 um and the second device well has a depth of about 1.8 um. For example, the MV device well may be deeper than the LV device well. Other configurations of the device wells may also be useful.

The device wells may be formed by implanting second polarity type dopants. An implant mask may be used to implant the second polarity type dopants. For example, the implant mask exposed the region in which dopants are to be implanted. The first and second device wells may be formed using separate implant processes and separate implant masks. Other implant processes may also be employed to form other device wells for other device regions. In the case device wells of other device regions are compatible, such as same dopant type, concentration depth, the same implant process may be used to form compatible wells. An anneal is performed after forming the device wells. The anneal activates the dopants.

Figure 3D:
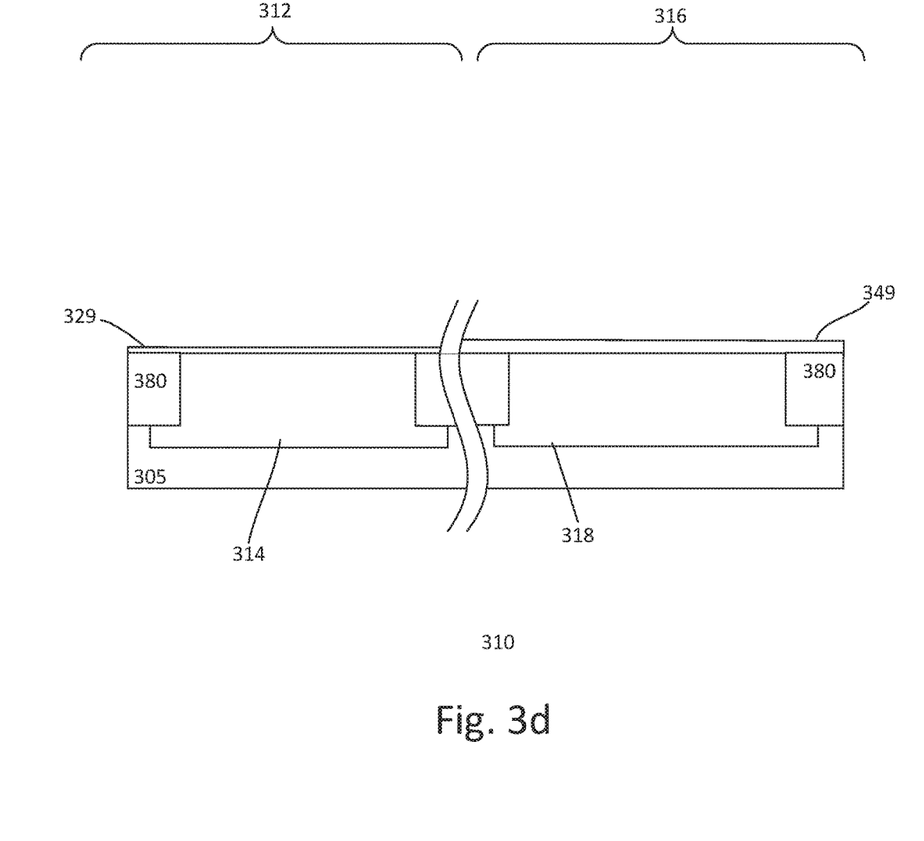

Referring to FIG. 3d, gate oxide layers are formed on the substrate. In one embodiment, a LV gate oxide 329 is formed on the surface of the substrate in the LV device region and a MV gate oxide 349 is formed on the surface of the substrate in the MV device region. The LV gate oxide has a thickness of about 2.5 nm while the MV gate oxide has a thickness of about 20 nm. In one embodiment, the gate oxide layers are thermal oxide layers. For example, the gate oxide layers are formed by thermal oxidation. The LV and MV gate oxide layers, for example, are formed using separate processes.

In one embodiment, the MV gate oxide layer is formed first by thermal deposition. The MV gate oxide is formed over both the first and second device regions. The thickness of the MV gate oxide is less than the desired MV gate oxide thickness. For example, the thickness of the initially formed MV gate oxide is equal to $T_{MV}$-$T_{LV}$, where $T_{MV}$ is the target thickness of the MV gate oxide and $T_{LV}$ is the target thickness of the LV gate oxide. The initially formed MV gate oxide is selected to be etched or removed from the first device region. Thereafter, thermal oxidation is performed to form the LV gate oxide in the first device region as well as to continue growing the MV gate oxide in the second device region. When the process is completed, LV gate oxide is formed in the first device region and MV gate oxide is formed in the second device region.

Figure 3E:
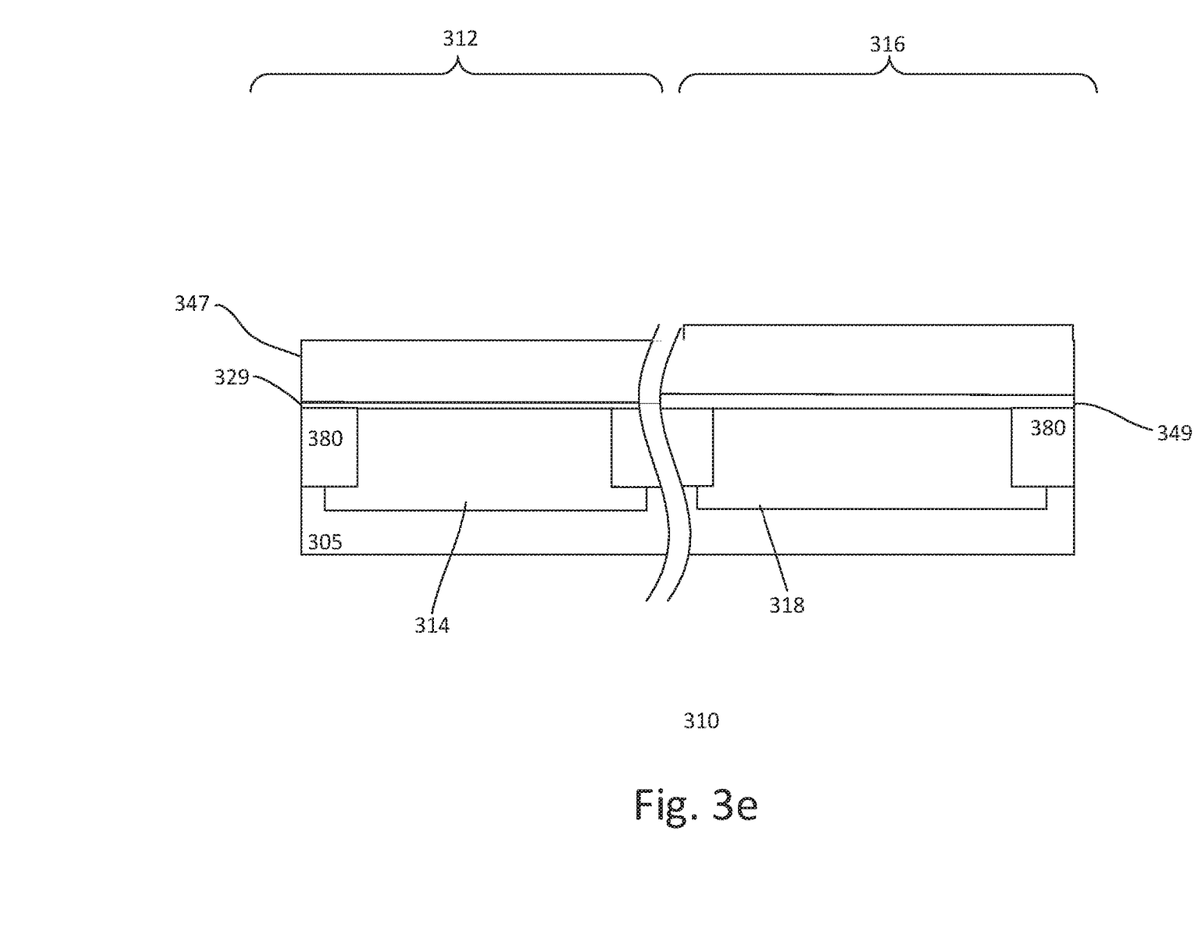

In FIG. 3e, a gate electrode layer 347 is formed on the substrate. The gate electrode layer covers the first and second device regions. The gate may also cover other device regions of the substrate. The gate electrode layer may be a polysilicon layer having a thickness of about 100 nm. The gate electrode layer may be formed by, for example, chemical vapor deposition (CVD). Other techniques for forming the gate electrode layer or thicknesses may also be useful. For example, the gate electrode layer can be formed as an amorphous or non-amorphous layer. In one embodiment, the gate electrode layer is polysilicon doped with first polarity type dopants to reduce sheet resistance. The concentration of dopants in the gate electrode layer may be about $10^{20}$-$10^{21}$ cm$^{-3}$. Various techniques may be employed to dope the gate electrode layer, for example, in-situ doping or ion implantation. The gate electrode layer is a conformal layer. For example, the gate electrode layer inherits the underlying topography. Since the top surface of the MV gate oxide layer is higher, the gate electrode layer in the second device region will be higher as well.

Other types of gate dielectric and gate electrode materials or thicknesses may also be useful. For example, the gate dielectric material may be a high k dielectric material while the gate electrode may be a metal gate electrode material. Other configurations of gate layers may also be useful. For example, the gate dielectric and/or gate electrode layers may have multiple layers. The layers can be formed by various techniques, such as thermal oxidation, CVD and sputtering.

Figure 3F:
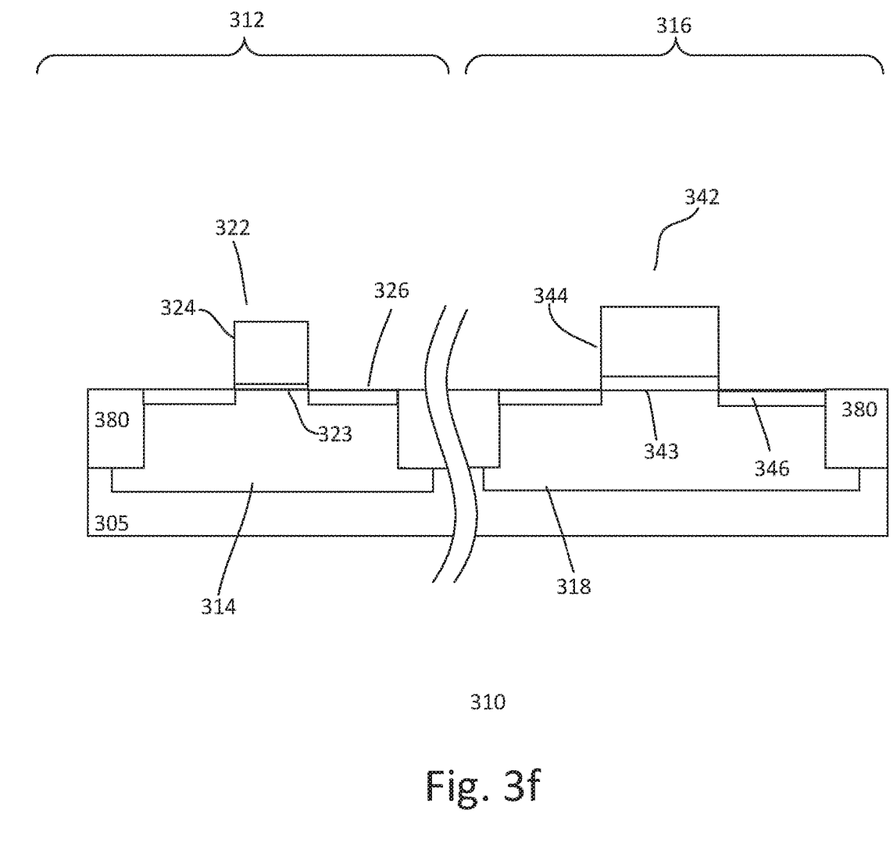

Referring to FIG. 3f, the gate layers are patterned to form gates. For example, a LV gate 322 is formed in the first or LV region and a MV gate 342 is formed in the second or MV region. The gate layers may be pattered to form other gates in other device regions. The LV gate includes a LV gate electrode 324 over a LV gate oxide 323; the MV gate includes a MV gate electrode 344 over a MV gate oxide 343. As shown, the LV gate is narrower than the MV gate.

To form the gates, mask and etch techniques may be used. For example, a soft mask, such as a photoresist mask, may be formed over the gate electrode layer. An exposure source may selectively expose the photoresist layer through a reticle containing the desired pattern. After selectively exposing the photoresist layer, it is developed to form openings corresponding to the location where the gate layers are to be removed. To improve lithographic resolution, an anti-reflective coating (ARC) may be used below the photoresist layer.

The patterned mask layer serves as an etch mask for a subsequent etch process. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form the LV and MV gates. The etch may also be used for other gates in other device regions.

After forming the gate, LV LD regions are formed in the LV region 326 adjacent to the LV gate and MV LD regions 346 are formed adjacent to the MV gate. The LD regions include first polarity type dopants. In one embodiment, the LV LD regions have a dopant concentration of about $10^{19}$ cm$^{-3}$ while the MV LD regions have a dopant concentration of about $10^{18}$ cm$^{-3}$. The LV LD region has a depth of about 0.05 um while the MV LD region has a depth of about 0.2 um to 0.4 um. Other depths may also be useful. In one embodiment, separate implant processes are used to form the LV LD regions and MV LD regions. For example, separate implants using different implant masks are employed. The implants to form the LD regions may be angle implants. For example, quad-angled implants may be performed to form the LD regions. The angle implants extend the LD regions under the gates.

In another embodiment, the MV LD regions can be formed prior to the gate formation. For example, the MV LD regions may be formed prior to the gate electrode layer, such as polysilicon, deposition. An implant mask may be used to implant first polarity type dopants to form the MV LD regions. The implant mask can be extended to the gate edge region. The implant, for example, can be angled or perpendicular.

Figure 3G:
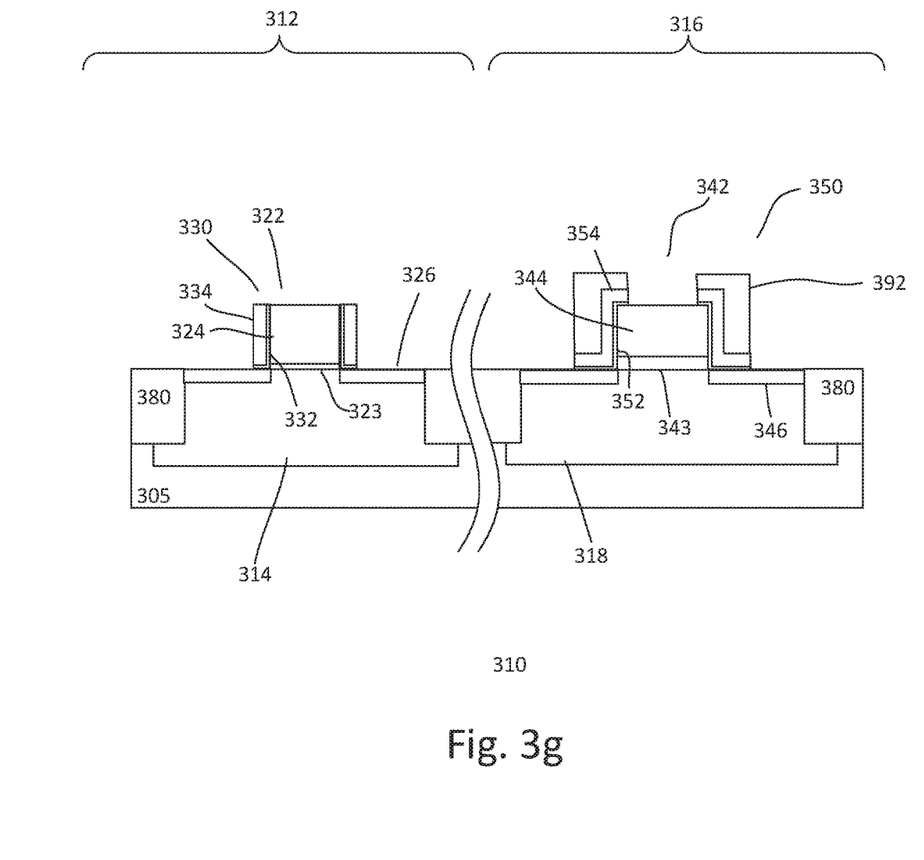

In FIG. 3g, a spacer layer is formed on the substrate. In one embodiment, the spacer layer includes a composite spacer layer having an oxide layer lining the substrate and gates and a nitride layer thereover. The oxide layer, for example, is a low temperature oxide (LTO). The LTO and nitride layers, for example, may be formed by CVD.

In one embodiment, a soft mask, such as a photoresist layer is formed on the substrate, covering the spacer layer. The soft mask is patterned to leave mask portions 392 protecting portions of the spacer layer corresponding to extended L spacers which are to be formed on the sidewalls of the MV gate. Remaining portions of the spacer layer are exposed or unprotected by the mask. An anisotropic etch, such as RIE, is performed to form non-extended spacers 330 on the sidewalls of the LV gate and extended L spacers 350 on sidewalls of the MV gate. The non-extended spacers and extended L spacers are formed simultaneously. After the etch, the mask is removed. For example, the mask is removed by ashing.

As described, the MV gate includes extended L spacers on both gate sidewalls. In alternatively embodiment, an extended L spacer is formed only on one gate sidewall while non-extended spacer, such as those formed on the LV gate, is formed on the other gate sidewall. For example, the extended L spacer is formed on the drain side of the transistor which is subjected to high drain bias.

Figure 3H:
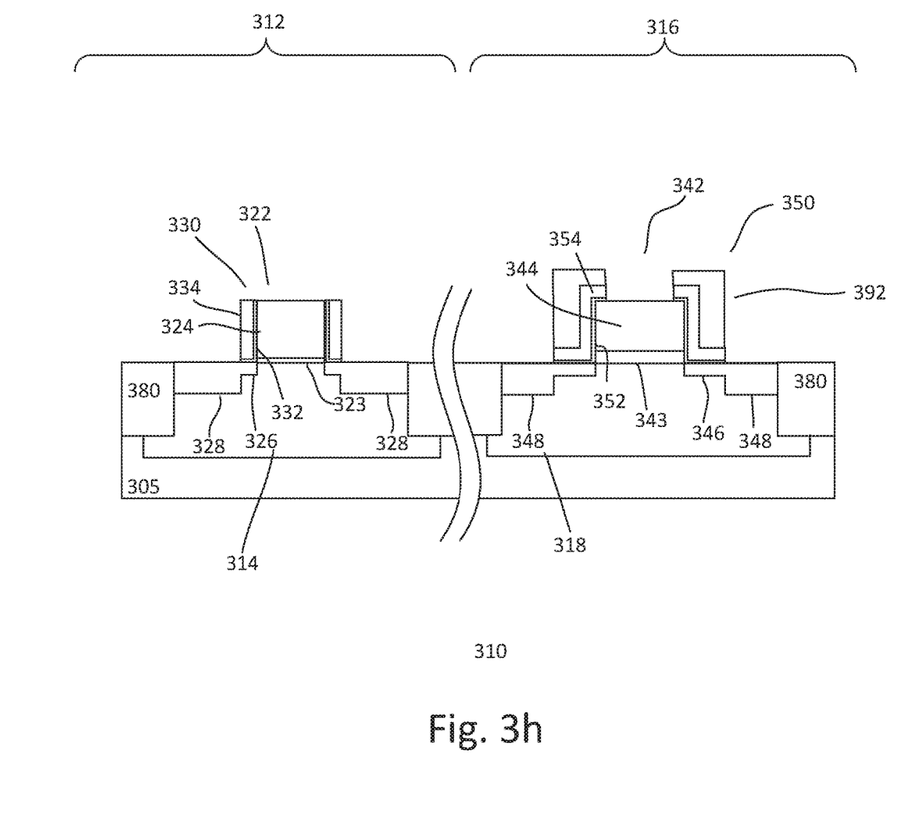

Referring to FIG. 3h, first polarity type LV HD regions 328 are formed in the LV device region and first polarity type MV HD regions 348 are formed in the MV device region. The dopant concentration of the HD regions may be about $10^{20}$-$10^{21}$ cm$^{-3}$ while a depth of the HD regions may be about 0.1 um. An implant using an implant mask may be performed to form the first polarity type HD regions. Both the LV HD regions and MV HD regions may be formed using the same implant process. Forming the HD regions completes the formation of LV S/D regions for the LV transistor and MV S/D regions for the MV transistor. As shown, the extended L spacers displaces the MV HD regions farther away from the MV gate than without the extend L spacers. For example, the MV transistor has a greater S/D to poly distance than the LV transistor due to the extended L spacers.

Figure 3I:
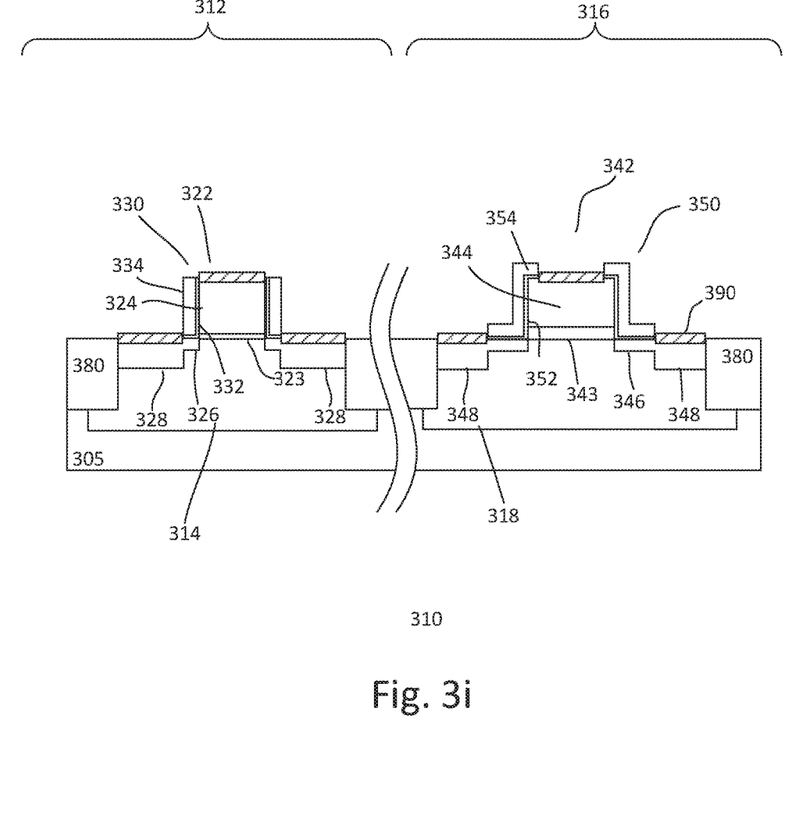

In FIG. 3i, metal silicide contacts 390 are formed on terminals or contact regions of the LV and MV transistors. For example, metal silicide contacts may be provided on exposed top surface of the gate electrode and exposed S/D regions. Metal silicide contacts may also be formed in other contact regions for other devices as well as well contacts. The silicide contacts, for example, may be nickel-based silicide contacts. Other types of metal silicide contacts may also be useful. For example, the metal silicide contact may be cobalt silicide (CoSi). The silicide contacts may be about 50-300 Å thick. Other thickness of silicide contacts may also be useful. The silicide contacts may be employed to reduce contact resistance and facilitate contact to the back-end-of-line metal interconnects.

To form the silicide contacts, a metal layer is deposited on the surface of the substrate. The metal layer, for example, may be cobalt or an alloy thereof. Other types of metallic layers, such as nickel, or alloys thereof, may also be used. The metal layer can be formed by physical vapor deposition (PVD). Other types of metal elements that can be formed by other types of processes can also be useful.

A first anneal may be performed. The first anneal diffuses the metal dopants into the active substrate, forming a silicide layer. The first anneal, for example, is performed at a temperature of about 500° C. for about 30 seconds. Excess metal not used in the silicidation of the active surface is removed by, for example, a wet removal process. For example, unreacted metal material is removed selectively to the silicide contacts. A second anneal may be performed to enhance the material properties of the silicide layer, for example, lower resistivity of the silicide layer. The first and second annealing processes may be a rapid thermal anneal (RTA). Other annealing parameters or techniques may also be useful to form the silicide contacts.

There after back-end-of-line processing may be performed to form interconnects of the device. Other processes may also be performed to complete the formation of the device. Such processes may include, for example, final passivation, dicing, packaging and testing.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device, comprising:
   providing a substrate, wherein the substrate is prepared with
      a low voltage (LV) device region, and
      a medium voltage (MV) device region;
   forming a LV gate in the LV device region;
   forming LV lightly doped (LD) regions in the substrate in the LV device region adjacent to the LV gate;
   forming a MV gate in the MV device region;
   forming MV lightly doped (LD) regions in the substrate in the MV device region adjacent to the MV gate;
   forming a spacer layer on the substrate, wherein the spacer layer lines the substrate, the LV gate and the MV gate;
   patterning the spacer layer, wherein patterning the spacer layer simultaneously forms first and second non-extended spacers on first and second sidewalls of the LV gate, and a first extended L-shaped spacer on a first sidewall of the MV gate, wherein the first extended L-shaped spacer overlaps a top surface of the MV gate by an overlapping portion, and a portion of the top surface of the MV gate adjacent to the overlapping portion is exposed;
   forming LV heavily doped (HD) regions in the substrate adjacent to the non-extended spacers on first and second sidewalls of the LV gate; and
   forming first and second MV heavily doped (HD) regions in the substrate, wherein the first MV HD region is adjacent to the first extended L-shaped spacer on the first sidewall of the MV gate, wherein the first extended L-shaped spacer displaces the first MV HD region from the first sidewall of the MV gate by a MV distance $D_M$ which is sufficient to reduce gate induced drain leakage (GIDL) and impact ionization of a MV transistor in the MV device region.

2. The method of claim 1 wherein the non-extended spacers and the first extended L-shaped spacer are composite spacers, and the composite spacers comprise a silicon oxide layer and a silicon nitride layer.

3. The method of claim 1 further comprising:
   forming metal silicide contacts on the LV HD regions, the first and second MV HD regions, a top surface of the LV gate, and the exposed portion of the top surface of the MV gate.

4. The method of claim 3 wherein the metal silicide contacts comprise nickel-based silicide or cobalt silicide.

5. The method of claim 1 wherein the MV LD regions have lighter dopant concentrations than the LV LD regions.

6. The method of claim 1 wherein the LV LD region is formed by an angle implant.

7. The method of claim 1 wherein the MV LD region is formed either by an angle implant or by having a specific implant opening extended into a gate edge before the MV gate formation.

8. The method of claim 1 wherein:
   the first sidewall of the MV gate with the first extended-shaped L spacer is a drain side having high drain bias; and
   a second sidewall of the MV gate comprises a non-extended MV spacer to form an asymmetrical MV transistor.

9. The method of claim 1 wherein patterning the spacer layer forms:
   the first extended L-shaped spacer on the first sidewall of the MV gate, and
   a second extended L-shaped spacer on a second sidewall of the MV gate; and
   wherein the top surface of the MV gate between the first and second extended L-shaped spacers is exposed, and the first and second extended L-shaped spacers displace the first and second MV HD regions by the distance $D_M$ which is sufficient to reduce the GIDL and impact ionization of the MV transistor.

10. The method of claim 1 wherein the overlapping portion has a length $O_G$ equal to about 10 nm.

11. A method of forming a device, comprising:
   providing a substrate, wherein the substrate is prepared with
      a low voltage (LV) device region, and
      a medium voltage (MV) device region;
   forming a LV gate in the LV device region;
   forming LV lightly doped (LD) regions in the substrate in the LV device region adjacent to the LV gate;
   forming a MV gate in the MV device region;
   forming MV lightly doped (LD) regions in the substrate in the MV device region adjacent to the MV gate;
   forming a spacer layer on the substrate, the spacer layer lines the substrate, the LV gate and the MV gate;
   patterning the spacer layer, wherein patterning the spacer layer simultaneously forms first and second non-extended spacers on first and second sidewalls of the LV gate, and a first extended L-shaped spacer on a first sidewall of the MV gate, wherein a portion of a top surface of the MV gate adjacent to the first extended L-shaped spacer is exposed;

forming LV heavily doped (HD) regions in the substrate adjacent to the non-extended spacers on first and second sidewalls of the LV gate; and forming first and second MV heavily doped (HD) regions in the substrate, wherein the first MV HD region is adjacent to the first extended L-shaped spacer on the first sidewall of the MV gate, wherein the first extended L-shaped spacer displaces the first MV HD region from the first sidewall of the MV gate by a MV distance $D_M$ which is sufficient to reduce gate induced drain leakage (GIDL) and impact ionization of a MV transistor in the MV device region, wherein patterning the spacer layer comprises:
  forming a mask layer on the substrate covering the spacer layer,
  patterning the mask layer to form a patterned etch mask which protects the spacer layer where the extended L-shaped spacers are to be formed and exposes remaining portions of the spacer layer,
  performing an anisotropic etch using the patterned etch mask to form the non-extended spacers on first and second sidewalls of the LV gate and the first extended L-shaped spacer the first sidewall of the MV gate, and
  removing the patterned etch mask by ashing.

12. A method of forming a device, comprising:
providing a substrate, wherein the substrate is includes a medium voltage (MV) device region;
forming a MV gate in the MV device region;
forming MV lightly doped (LD) regions in the substrate in the MV device region adjacent to the MV gate;
forming a spacer layer on the substrate, the spacer layer lines the substrate and the MV gate;
patterning the spacer layer, wherein patterning the spacer layer forms a first extended L-shaped spacer on a first sidewall of the MV gate and a second extended L-shaped spacer on a second sidewall of the MV gate, wherein the first extended L-shaped spacer includes an overlapping portion that extends across a top surface of the MV gate by a length, $O_G$, and a portion of a top surface of the MV gate adjacent the overlapping portion and between the first extended L-shaped spacer and the second extended L-shaped spacer is exposed; and forming first and second MV heavily doped (HD) regions in the substrate, wherein the first MV HD region is adjacent to the first extended L-shaped spacer, wherein the first extended L-shaped spacer displaces the first MV HD region from the first sidewall of the MV gate by a MV distance $D_M$, and the second extended L-shaped spacer displaces the second MV HD region from the second sidewall of the MV gate by the MV distance $D_M$.

13. The method of claim 12 wherein the MV distance $D_M$ is sufficient to reduce GIDL and impact ionization of a MV transistor in the MV device region.

14. The method of claim 12 wherein the first extended L-shaped spacer is a composite spacer, and the composite spacer comprises a silicon oxide layer and a silicon nitride layer.

15. The method of claim 12 further comprising:
providing metal silicide contacts on the first and second MV HD regions and on the exposed top surface of the MV gate.

16. The method of claim 15 wherein the metal silicide contacts comprise nickel-based silicide or cobalt silicide.

17. The method of claim 12 wherein the substrate further includes a low voltage (LV) device region, and further comprising:
forming a LV gate in the LV device region;
forming LV lightly doped (LD) regions in the substrate in the LV device region adjacent to the LV gate;
wherein patterning the spacer layer also forms first and second non-extended spacers on first and second sidewalls of the LV gate; and
forming LV HD regions in the substrate adjacent to the non-extended spacers on the first and second sidewalls of the LV gate.

18. The method of claim 12 wherein the length $O_G$ is equal to about 10 nm.

* * * * *